United States Patent
Diaz et al.

(10) Patent No.: US 10,251,279 B1
(45) Date of Patent: Apr. 2, 2019

(54) PRINTED CIRCUIT BOARD MOUNTING WITH TABS

(71) Applicant: ABL IP Holding LLC, Atlanta, GA (US)

(72) Inventors: Luis Diaz, Nuevo Leon (MX); Aaron Feldman, Atlanta, GA (US); Matthew Scott Hoch, McDonough, GA (US); Eric Rodriguez, Smyrna, GA (US)

(73) Assignee: ABL IP Holding LLC, Atlanta, GA (US)

( * ) Notice: Subject to any disclaimer, the term of this patent is extended or adjusted under 35 U.S.C. 154(b) by 0 days.

(21) Appl. No.: 15/862,050

(22) Filed: Jan. 4, 2018

(51) Int. Cl.
| | |
|---|---|
| *H05K 1/18* | (2006.01) |
| *H05K 3/00* | (2006.01) |
| *H05K 3/32* | (2006.01) |
| *F21V 19/00* | (2006.01) |
| *H05K 1/14* | (2006.01) |

(52) U.S. Cl.
CPC ........... *H05K 1/188* (2013.01); *F21V 19/001* (2013.01); *H05K 1/145* (2013.01); *H05K 1/181* (2013.01); *H05K 3/0061* (2013.01); *H05K 3/326* (2013.01); *H01L 2924/12041* (2013.01)

(58) Field of Classification Search
CPC ...... F21S 4/20; F21V 19/004; F21Y 2103/10; F21Y 2115/10; G02B 6/0031; G02B 6/0068; G02B 6/0073; G02B 6/009; G02F 1/133615; G02F 2201/465
See application file for complete search history.

(56) References Cited

U.S. PATENT DOCUMENTS

| | | | |
|---|---|---|---|
| 3,019,333 A | 1/1962 | Pascucci | |
| 5,403,102 A | 4/1995 | Yokoyama | |
| 5,440,470 A | 8/1995 | Ly | |
| 5,934,915 A | 8/1999 | Henningsson et al. | |
| 6,114,626 A | 9/2000 | Barnes et al. | |
| 6,215,674 B1 | 4/2001 | Bertolami | |
| 6,278,614 B1 | 8/2001 | Beaman et al. | |
| 6,327,160 B1 | 12/2001 | Liao | |
| 6,424,537 B1 * | 7/2002 | Paquin | H05K 7/142 |
| | | | 211/41.17 |

(Continued)

FOREIGN PATENT DOCUMENTS

JP  2014116299  6/2014

OTHER PUBLICATIONS

"LT-F562A_G2", Available online at: http://www.samsung.com/global/business/led/products/led-engine/ambient-light-engine (Mar. 28, 2016) (16 pages).

(Continued)

*Primary Examiner* — Yuriy Semenenko
(74) *Attorney, Agent, or Firm* — Kilpatrick Townsend & Stockton LLP

(57) ABSTRACT

Embodiments relate to systems and methods for securing one or more printed circuit boards to a substrate. The substrate may include retention tabs that form a receiving slot that receives an edge of the printed circuit board. The retention tabs and printed circuit board may have corresponding engaging features designed to retain the printed circuit board within the receiving slot and that, in some embodiments, can permit slight movement of the printed circuit board within the receiving slot to accommodate any thermal expansion of the board during use.

17 Claims, 4 Drawing Sheets

(56) References Cited

U.S. PATENT DOCUMENTS

| | | |
|---|---|---|
| 6,424,538 B1 | 7/2002 | Paquin |
| 6,428,352 B1 | 8/2002 | Boyden |
| 6,582,100 B1 | 6/2003 | Hochstein et al. |
| 6,590,773 B1 | 7/2003 | Lin |
| 6,709,285 B1 | 3/2004 | Chou et al. |
| 6,737,791 B2 | 5/2004 | McCullough et al. |
| 6,771,512 B2 | 8/2004 | Paquin et al. |
| 6,937,475 B2 | 8/2005 | Rigimbal et al. |
| 6,964,581 B2 | 11/2005 | Chen et al. |
| 6,998,650 B1 | 2/2006 | Wu |
| 7,207,710 B2 | 4/2007 | Kim |
| 7,385,830 B2 | 6/2008 | Liu et al. |
| 7,396,247 B2 | 7/2008 | Lin |
| 7,510,317 B2 | 3/2009 | Murakami et al. |
| 7,612,299 B2 | 11/2009 | Chen |
| 8,192,059 B2 | 6/2012 | Yokota et al. |
| 8,226,280 B2 | 7/2012 | Daily et al. |
| 8,408,743 B1 | 4/2013 | Chen et al. |
| 8,430,520 B2 | 4/2013 | Takeba |
| 8,430,554 B2 | 4/2013 | Hasegawa |
| 8,449,145 B1 | 5/2013 | Berry et al. |
| 8,454,183 B2 | 6/2013 | Hisada |
| 8,475,000 B2 | 7/2013 | Tamai |
| 8,485,685 B2 | 7/2013 | He et al. |
| 8,536,768 B2 | 9/2013 | Van Gennip et al. |
| 8,622,361 B2 | 1/2014 | Wronski |
| 8,629,574 B2 | 1/2014 | Porter et al. |
| 8,629,631 B1 | 1/2014 | Rhodes et al. |
| 8,629,750 B2 | 1/2014 | Spalding |
| 8,632,214 B1 | 1/2014 | Tickner et al. |
| 8,633,391 B2 | 1/2014 | Strong et al. |
| 8,634,482 B2 | 1/2014 | Towers et al. |
| 8,636,387 B1 | 1/2014 | Wronski et al. |
| 8,638,537 B2 | 1/2014 | Kester et al. |
| D698,975 S | 2/2014 | Blessitt et al. |
| D698,978 S | 2/2014 | Bryant |
| D699,681 S | 2/2014 | Slack |
| D700,382 S | 2/2014 | Christ et al. |
| 8,646,936 B2 | 2/2014 | Goyal et al. |
| 8,646,948 B1 | 2/2014 | Reo et al. |
| 8,649,882 B2 | 2/2014 | Stelzer et al. |
| 8,654,869 B2 | 2/2014 | Jones et al. |
| 8,659,279 B2 | 2/2014 | George et al. |
| 8,659,379 B2 | 2/2014 | Yan et al. |
| 8,659,860 B2 | 2/2014 | George et al. |
| 8,659,866 B2 | 2/2014 | Douglass et al. |
| D700,987 S | 3/2014 | Nepple et al. |
| 8,669,720 B2 | 3/2014 | Goyal et al. |
| 8,673,855 B2 | 3/2014 | Kim et al. |
| 8,675,332 B1 | 3/2014 | Green et al. |
| 8,680,756 B2 | 3/2014 | Rong et al. |
| D701,988 S | 4/2014 | Clements |
| D702,640 S | 4/2014 | Restrepo et al. |
| D702,866 S | 4/2014 | Blincoe et al. |
| D703,139 S | 4/2014 | Dodal et al. |
| 8,686,662 B1 | 4/2014 | Bragg et al. |
| 8,690,198 B2 | 4/2014 | Saber et al. |
| 8,690,595 B2 | 4/2014 | Barna |
| 8,692,139 B2 | 4/2014 | Aldrich et al. |
| 8,696,169 B2 | 4/2014 | Tickner et al. |
| 8,696,186 B2 * | 4/2014 | Hsu .................. G09F 19/02 362/249.02 |
| 8,699,197 B2 | 4/2014 | Douglass et al. |
| 8,699,198 B2 | 4/2014 | Spalding |
| 8,699,209 B2 | 4/2014 | Barna |
| 8,701,372 B2 | 4/2014 | Nuernberger et al. |
| 8,702,047 B2 | 4/2014 | Nuernberger et al. |
| 8,706,828 B2 | 4/2014 | Brabec et al. |
| 8,708,518 B1 | 4/2014 | Ehresman et al. |
| 8,712,052 B2 | 4/2014 | Landheer |
| D705,734 S | 5/2014 | Dodal et al. |
| D705,974 S | 5/2014 | Blessitt et al. |
| 8,715,008 B2 | 5/2014 | von zur Muehlen |
| 8,720,791 B2 | 5/2014 | Slingsby et al. |
| 8,721,112 B2 | 5/2014 | Hetrick et al. |
| 8,721,120 B2 | 5/2014 | Christ et al. |
| 8,726,587 B2 | 5/2014 | Nuernberger et al. |
| 8,727,573 B2 | 5/2014 | Holder |
| 8,729,396 B2 | 5/2014 | Zhang et al. |
| 8,746,921 B1 | 6/2014 | Bigge |
| 8,746,927 B1 | 6/2014 | Nepple et al. |
| 8,751,066 B1 | 6/2014 | Towers et al. |
| 8,754,341 B2 | 6/2014 | Manahan et al. |
| 8,760,151 B2 | 6/2014 | Mcbee et al. |
| 8,760,254 B2 | 6/2014 | Mcbee et al. |
| 8,764,220 B2 | 7/2014 | Chan et al. |
| 8,766,821 B2 | 7/2014 | Restrepo et al. |
| 8,774,622 B2 | 7/2014 | Weintraub et al. |
| 8,777,460 B2 | 7/2014 | Newton |
| 8,777,535 B2 | 7/2014 | Manahan |
| 8,777,678 B2 | 7/2014 | Barna |
| 8,779,284 B2 | 7/2014 | Wagner et al. |
| 8,779,675 B2 | 7/2014 | Mikani et al. |
| 8,779,691 B1 | 7/2014 | Rhodes |
| 8,779,693 B1 | 7/2014 | Blalock et al. |
| 8,785,804 B2 | 7/2014 | Gibson |
| 8,789,978 B2 | 7/2014 | Tickner et al. |
| D711,031 S | 8/2014 | Moghal et al. |
| D711,032 S | 8/2014 | Moghal et al. |
| D711,037 S | 8/2014 | Lehman et al. |
| D712,082 S | 8/2014 | Harpenau et al. |
| 8,794,792 B1 | 8/2014 | Moghal et al. |
| 8,794,803 B1 | 8/2014 | Paulsel |
| 8,797,773 B2 | 8/2014 | George |
| 8,808,032 B2 | 8/2014 | Fischer et al. |
| 8,808,033 B2 | 8/2014 | White |
| 8,816,654 B2 | 8/2014 | Kletti et al. |
| 8,817,471 B2 | 8/2014 | Barna |
| D712,581 S | 9/2014 | Scarlata et al. |
| D713,081 S | 9/2014 | Scarlata et al. |
| 8,820,985 B1 | 9/2014 | Tam et al. |
| 8,821,622 B2 | 9/2014 | Manahan et al. |
| 8,830,023 B2 | 9/2014 | Darr |
| 8,830,645 B2 | 9/2014 | Kojovic |
| 8,844,749 B2 | 9/2014 | Manahan et al. |
| 8,845,129 B1 | 9/2014 | Holder et al. |
| 8,845,141 B2 | 9/2014 | Wronski et al. |
| 8,845,144 B1 | 9/2014 | Davis et al. |
| 8,845,145 B1 | 9/2014 | Tam et al. |
| 8,845,793 B2 | 9/2014 | Manahan et al. |
| 8,848,486 B1 | 9/2014 | Elwell |
| D714,992 S | 10/2014 | Bryant |
| D715,480 S | 10/2014 | Christ et al. |
| D716,489 S | 10/2014 | O'Leary et al. |
| 8,851,437 B2 | 10/2014 | Verma et al. |
| 8,851,711 B2 | 10/2014 | Ladewig et al. |
| 8,853,942 B1 | 10/2014 | Lewis, Jr. et al. |
| 8,854,174 B2 | 10/2014 | Su et al. |
| 8,858,053 B1 | 10/2014 | Patrick et al. |
| 8,866,485 B1 | 10/2014 | Lacey et al. |
| D717,486 S | 11/2014 | Lowell |
| D718,485 S | 11/2014 | Wright |
| D718,489 S | 11/2014 | Wronski et al. |
| 8,876,328 B2 | 11/2014 | Wegner |
| 8,882,057 B2 | 11/2014 | Dworak, Jr. |
| 8,884,549 B2 | 11/2014 | Shah et al. |
| D719,511 S | 12/2014 | Dodal et al. |
| D719,688 S | 12/2014 | Goyal et al. |
| D719,699 S | 12/2014 | Bryant |
| D720,295 S | 12/2014 | Dodal et al. |
| 8,899,786 B1 | 12/2014 | Moghal et al. |
| 8,904,606 B2 | 12/2014 | Aldrich et al. |
| 8,905,441 B2 | 12/2014 | Barna |
| 8,905,602 B2 | 12/2014 | Thompson, III |
| 8,907,582 B2 | 12/2014 | Neundorfer et al. |
| 8,907,587 B2 | 12/2014 | Guckin et al. |
| 8,908,357 B2 | 12/2014 | Manahan |
| 8,910,141 B2 | 12/2014 | Bahls et al. |
| 8,910,373 B2 | 12/2014 | Yan et al. |
| 8,911,116 B2 | 12/2014 | Blincoe et al. |
| 8,911,121 B2 | 12/2014 | Tickner et al. |
| 8,911,132 B1 | 12/2014 | Foy et al. |
| 8,911,264 B2 | 12/2014 | Goyal et al. |
| 8,913,244 B1 | 12/2014 | Broughton |

(56) References Cited

U.S. PATENT DOCUMENTS

| | | |
|---|---|---|
| 8,915,609 B1 | 12/2014 | Shah et al. |
| 8,915,624 B2 | 12/2014 | Manahan |
| 8,926,360 B2 | 1/2015 | Manahan et al. |
| 8,928,242 B2 | 1/2015 | Goyal et al. |
| 8,939,418 B2 | 1/2015 | Green et al. |
| 8,939,608 B1 | 1/2015 | Patrick |
| 8,939,615 B2 | 1/2015 | Rong et al. |
| 8,941,021 B2 | 1/2015 | Gouhl et al. |
| 8,941,457 B2 | 1/2015 | Yan et al. |
| D722,562 S | 2/2015 | Restrepo et al. |
| D723,206 S | 2/2015 | Lewis, Jr. et al. |
| 8,944,627 B1 | 2/2015 | Hetrick |
| 8,956,170 B2 | 2/2015 | White |
| 8,957,649 B2 | 2/2015 | Kromrey et al. |
| 8,958,183 B2 | 2/2015 | Lacey et al. |
| 8,960,971 B1 | 2/2015 | Newton |
| 8,960,973 B1 | 2/2015 | Kathawate et al. |
| 8,968,036 B2 | 3/2015 | Ledgerwood et al. |
| 8,969,741 B2 | 3/2015 | Aldrich et al. |
| 8,974,074 B1 | 3/2015 | Duchesneau et al. |
| 8,979,329 B1 | 3/2015 | Moore et al. |
| 8,979,559 B2 | 3/2015 | Aldrich et al. |
| 8,979,600 B2 | 3/2015 | von zur Muehlen et al. |
| 8,988,183 B2 | 3/2015 | Darr et al. |
| 8,992,649 B2 | 3/2015 | Manahan et al. |
| 8,994,296 B1 | 3/2015 | Chan |
| 8,994,354 B2 | 3/2015 | George |
| D726,359 S | 4/2015 | Grigore et al. |
| D726,940 S | 4/2015 | Goyal et al. |
| D727,546 S | 4/2015 | Goyal et al. |
| D728,153 S | 4/2015 | Blessitt |
| 8,998,440 B1 | 4/2015 | Wu et al. |
| 9,000,736 B2 | 4/2015 | Gumaer |
| 9,000,875 B2 | 4/2015 | Mcbee et al. |
| 9,004,435 B2 | 4/2015 | Wronski |
| 9,007,037 B2 | 4/2015 | Daley et al. |
| 9,010,956 B1 | 4/2015 | Davis |
| 9,017,093 B1 | 4/2015 | Packard, III et al. |
| 9,020,648 B2 | 4/2015 | Doljack |
| D729,432 S | 5/2015 | Newton et al. |
| 9,022,603 B1 | 5/2015 | Moghal et al. |
| 9,025,315 B2 | 5/2015 | Rustomji et al. |
| 9,033,547 B2 | 5/2015 | Manahan et al. |
| 9,033,550 B1 | 5/2015 | Tickner |
| D731,970 S | 6/2015 | Kamath et al. |
| 9,046,231 B2 | 6/2015 | Christ et al. |
| 9,052,070 B2 | 6/2015 | Davis et al. |
| 9,052,081 B1 | 6/2015 | Paulsel |
| 9,052,086 B2 | 6/2015 | Broughton |
| 9,052,090 B1 | 6/2015 | Laso et al. |
| 9,052,097 B2 | 6/2015 | Blincoe et al. |
| 9,052,101 B1 | 6/2015 | Kathawate et al. |
| 9,053,863 B2 | 6/2015 | Rustomji et al. |
| 9,055,623 B1 | 6/2015 | Bohler et al. |
| 9,060,607 B1 | 6/2015 | Canales |
| 9,062,837 B2 | 6/2015 | Wronski et al. |
| 9,062,849 B2 | 6/2015 | Gennetten et al. |
| 9,062,866 B1 | 6/2015 | Christ et al. |
| 9,068,722 B2 | 6/2015 | Wronski et al. |
| 9,069,106 B1 | 6/2015 | Blessitt et al. |
| D735,144 S | 7/2015 | Restrepo et al. |
| D735,391 S | 7/2015 | Blessitt et al. |
| D735,401 S | 7/2015 | Clements |
| D735,402 S | 7/2015 | Goyal et al. |
| 9,080,739 B1 | 7/2015 | Sayers |
| 9,080,747 B1 | 7/2015 | Hetrick |
| 9,083,180 B2 | 7/2015 | Dodal et al. |
| 9,084,306 B1 | 7/2015 | Bohler et al. |
| 9,086,198 B2 | 7/2015 | Wronski et al. |
| 9,086,214 B1 | 7/2015 | Blalock et al. |
| 9,088,220 B2 | 7/2015 | Bavel |
| 9,093,764 B2 | 7/2015 | Manahan et al. |
| 9,253,848 B2 | 2/2016 | Hayman et al. |
| 9,458,869 B2 | 10/2016 | Van Gompel et al. |
| 9,587,810 B2 | 3/2017 | Parekh |
| 9,588,274 B2 | 3/2017 | Zhou |
| 2004/0114364 A1 | 6/2004 | Chen |
| 2005/0181671 A1* | 8/2005 | Hu ............ H01R 13/6582 439/607.25 |
| 2008/0298058 A1 | 12/2008 | Kan et al. |
| 2009/0135583 A1 | 5/2009 | Hillman et al. |
| 2009/0323334 A1 | 12/2009 | Roberts et al. |
| 2010/0226125 A1* | 9/2010 | Liao ............ F21V 19/004 362/235 |
| 2011/0069493 A1 | 3/2011 | Huang |
| 2012/0020086 A1 | 1/2012 | Kataoka |
| 2013/0100622 A1 | 4/2013 | Wang et al. |
| 2013/0128572 A1 | 5/2013 | Yoshizawa |
| 2013/0278860 A1 | 10/2013 | Choi et al. |
| 2013/0294061 A1 | 11/2013 | Sorensen et al. |
| 2014/0009931 A1 | 1/2014 | Tickner et al. |
| 2014/0013940 A1 | 1/2014 | Manahan et al. |
| 2014/0013948 A1 | 1/2014 | Manahan et al. |
| 2014/0014163 A1 | 1/2014 | McCarthy et al. |
| 2014/0015419 A1 | 1/2014 | Shah et al. |
| 2014/0019397 A1 | 1/2014 | Alexander |
| 2014/0021867 A1 | 1/2014 | Shah et al. |
| 2014/0023193 A1 | 1/2014 | Landheer |
| 2014/0028218 A1 | 1/2014 | Guckin et al. |
| 2014/0036544 A1 | 2/2014 | Bavel |
| 2014/0036694 A1 | 2/2014 | Courtice |
| 2014/0043133 A1 | 2/2014 | Douglass |
| 2014/0049956 A1 | 2/2014 | Manahan et al. |
| 2014/0049962 A1* | 2/2014 | Holder ............ F21K 9/00 362/244 |
| 2014/0054025 A1 | 2/2014 | DeCarr et al. |
| 2014/0058575 A1 | 2/2014 | Ashworth et al. |
| 2014/0061399 A1 | 3/2014 | Nuernberger |
| 2014/0062330 A1 | 3/2014 | Neundorfer et al. |
| 2014/0062340 A1 | 3/2014 | Elgayyar |
| 2014/0065874 A1 | 3/2014 | Ledgerwood et al. |
| 2014/0069711 A1 | 3/2014 | Barna |
| 2014/0071687 A1 | 3/2014 | Tickner et al. |
| 2014/0076897 A1 | 3/2014 | Manahan et al. |
| 2014/0076901 A1 | 3/2014 | Manahan et al. |
| 2014/0085776 A1 | 3/2014 | Fischer et al. |
| 2014/0085905 A1 | 3/2014 | Broughton |
| 2014/0087600 A1 | 3/2014 | von zur Muehlen et al. |
| 2014/0088776 A1 | 3/2014 | Brandt et al. |
| 2014/0088777 A1 | 3/2014 | Allmaras et al. |
| 2014/0090242 A1 | 4/2014 | Barna |
| 2014/0091582 A1 | 4/2014 | Manahan |
| 2014/0091583 A1 | 4/2014 | Manahan |
| 2014/0097966 A1 | 4/2014 | Alexander |
| 2014/0102780 A1 | 4/2014 | Aldrich et al. |
| 2014/0103175 A1 | 4/2014 | Neace |
| 2014/0104846 A1 | 4/2014 | Wronski |
| 2014/0111075 A1 | 4/2014 | Schneider et al. |
| 2014/0113500 A1 | 4/2014 | Goyal et al. |
| 2014/0117188 A1 | 5/2014 | Wronski |
| 2014/0117768 A1 | 5/2014 | Goyal |
| 2014/0118907 A1 | 5/2014 | Fellers et al. |
| 2014/0123123 A1 | 5/2014 | Bahls |
| 2014/0126205 A1* | 5/2014 | Davis ............ B29C 45/14467 362/244 |
| 2014/0126243 A1 | 5/2014 | Blessitt et al. |
| 2014/0138146 A1 | 5/2014 | Li et al. |
| 2014/0151203 A1 | 6/2014 | Gouhl et al. |
| 2014/0153144 A1 | 6/2014 | Lacey et al. |
| 2014/0153235 A1 | 6/2014 | Gennetten et al. |
| 2014/0153260 A1 | 6/2014 | Wronski |
| 2014/0158510 A1 | 6/2014 | Lacey et al. |
| 2014/0160742 A1 | 6/2014 | Rodgers et al. |
| 2014/0167934 A1 | 6/2014 | Fair et al. |
| 2014/0176011 A1 | 6/2014 | Szabados |
| 2014/0177169 A1 | 6/2014 | Restrepo et al. |
| 2014/0197261 A1 | 7/2014 | Witherbee |
| 2014/0198419 A1 | 7/2014 | Kojovic |
| 2014/0198420 A1 | 7/2014 | Kojovic |
| 2014/0199869 A1 | 7/2014 | Manahan et al. |
| 2014/0199881 A1 | 7/2014 | Manahan et al. |
| 2014/0209620 A1 | 7/2014 | Barna |
| 2014/0213191 A1 | 7/2014 | Courtice |
| 2014/0213311 A1 | 7/2014 | Courtice |

(56) References Cited

U.S. PATENT DOCUMENTS

| | | |
|---|---|---|
| 2014/0238726 A1 | 8/2014 | Kamath et al. |
| 2014/0240980 A1 | 8/2014 | Howe |
| 2014/0241533 A1 | 8/2014 | Gerrish et al. |
| 2014/0241735 A1 | 8/2014 | Bohler et al. |
| 2014/0246567 A1 | 9/2014 | Goyal et al. |
| 2014/0251774 A1 | 9/2014 | Gouhl et al. |
| 2014/0254065 A1 | 9/2014 | Rustomji et al. |
| 2014/0254066 A1 | 9/2014 | Rustomji et al. |
| 2014/0254152 A1 | 9/2014 | Bohler et al. |
| 2014/0254220 A1 | 9/2014 | George |
| 2014/0256188 A1 | 9/2014 | Manahan et al. |
| 2014/0263865 A1 | 9/2014 | Salian et al. |
| 2014/0264983 A1 | 9/2014 | Cape |
| 2014/0265556 A1 | 9/2014 | Sama Rubio et al. |
| 2014/0265637 A1 | 9/2014 | Kaluzny et al. |
| 2014/0266142 A1 | 9/2014 | Schaar |
| 2014/0266240 A1 | 9/2014 | Haensgen et al. |
| 2014/0266539 A1 | 9/2014 | Krishnamoorthy et al. |
| 2014/0266555 A1 | 9/2014 | Krishnamoorthy et al. |
| 2014/0268647 A1 | 9/2014 | Blondin et al. |
| 2014/0268869 A1 | 9/2014 | Blessitt et al. |
| 2014/0268874 A1 | 9/2014 | Clements et al. |
| 2014/0269704 A1 | 9/2014 | Alexander et al. |
| 2014/0270798 A1 | 9/2014 | Manahan |
| 2014/0272542 A1 | 9/2014 | Rustomji |
| 2014/0278150 A1 | 9/2014 | Baesler et al. |
| 2014/0283461 A1 | 9/2014 | Zhang et al. |
| 2014/0283462 A1 | 9/2014 | Zhang et al. |
| 2014/0283475 A1 | 9/2014 | Zhang et al. |
| 2014/0283480 A1 | 9/2014 | Zhang et al. |
| 2014/0283481 A1 | 9/2014 | Zhang et al. |
| 2014/0299730 A1 | 10/2014 | Green et al. |
| 2014/0300192 A1 | 10/2014 | Price et al. |
| 2014/0301087 A1 | 10/2014 | Wronski et al. |
| 2014/0301092 A1 | 10/2014 | Wronski et al. |
| 2014/0312691 A1 | 10/2014 | Doljack et al. |
| 2014/0313003 A1 | 10/2014 | Liu et al. |
| 2014/0313776 A1 | 10/2014 | Grigore |
| 2014/0313778 A1 | 10/2014 | Getzinger et al. |
| 2014/0321131 A1 | 10/2014 | Newton |
| 2014/0326498 A1 | 11/2014 | Romano |
| 2014/0327411 A1 | 11/2014 | Gumaer |
| 2014/0328096 A1 | 11/2014 | Gumaer |
| 2014/0328097 A1 | 11/2014 | Gumaer |
| 2014/0328415 A1 | 11/2014 | Gumaer |
| 2014/0332249 A1 | 11/2014 | Barna |
| 2014/0334155 A1 | 11/2014 | Christ et al. |
| 2014/0347037 A1 | 11/2014 | Mcbee et al. |
| 2015/0002024 A1 | 1/2015 | Shah et al. |
| 2015/0008666 A1 | 1/2015 | Stanzione |
| 2015/0009004 A1 | 1/2015 | Zhou et al. |
| 2015/0009678 A1 | 1/2015 | Hunter |
| 2015/0020873 A1 | 1/2015 | Nuernberger et al. |
| 2015/0026976 A1 | 1/2015 | Ledgerwood et al. |
| 2015/0049405 A1 | 2/2015 | Ramarge et al. |
| 2015/0050078 A1 | 2/2015 | Laughlin |
| 2015/0055370 A1 | 2/2015 | Gongola et al. |
| 2015/0062910 A1 | 3/2015 | Winters |
| 2015/0076156 A1 | 3/2015 | Manahan et al. |
| 2015/0076841 A1 | 3/2015 | Zhao et al. |
| 2015/0076989 A1 | 3/2015 | Walma et al. |
| 2015/0076992 A1 | 3/2015 | Walma |
| 2015/0085504 A1 | 3/2015 | Patrick |
| 2015/0087181 A1 | 3/2015 | Manahan et al. |
| 2015/0092425 A1 | 4/2015 | Thompson, III et al. |
| 2015/0100163 A1 | 4/2015 | Allmaras et al. |
| 2015/0103536 A1 | 4/2015 | Wronski et al. |
| 2015/0124449 A1 | 5/2015 | Wilcox et al. |
| 2015/0131271 A1 | 5/2015 | Green et al. |
| 2015/0132080 A1 | 5/2015 | Tran |
| 2015/0132581 A1 | 5/2015 | Li et al. |
| 2015/0132982 A1 | 5/2015 | Hagerty et al. |
| 2015/0132983 A1 | 5/2015 | Daly et al. |
| 2015/0137934 A1 | 5/2015 | von zur Muehlen et al. |
| 2015/0146421 A1 | 5/2015 | Scarlata et al. |
| 2015/0148456 A1 | 5/2015 | Eissmann et al. |
| 2015/0170820 A1 | 6/2015 | Kadir et al. |
| 2015/0176631 A1 | 6/2015 | McCarthy et al. |
| 2015/0177306 A1 | 6/2015 | Hedlund et al. |
| 2015/0179372 A1 | 6/2015 | Gouhl et al. |
| 2015/0198298 A1 | 7/2015 | Scarlata et al. |
| 2015/0198308 A1 | 7/2015 | Patrick |
| 2015/0198310 A1 | 7/2015 | Scarlata et al. |
| 2015/0207282 A1 | 7/2015 | Packard, III et al. |
| 2015/0208320 A1 | 7/2015 | Alexander et al. |
| 2015/0215027 A1 | 7/2015 | Lacey |
| 2015/0241035 A1 | 8/2015 | Dankelmann et al. |
| 2017/0034941 A1 | 2/2017 | McCurley et al. |
| 2017/0059139 A1* | 3/2017 | McCanless ........... F21V 17/164 |

OTHER PUBLICATIONS

"M-series 4ft", Available online at: http://www.samsung.com/global/business/led/products/led-engine/ambient-light-engine (Apr. 22, 2016) (17 pages).

Cooperindustries, Available online at: http://www.cooperindustries.com/content/public/en/lighting/products/recessed_linear_lighting/direct_indirect/_866921.html (2017) (10 pages).

Cooperindustries, "Cooper Lighting—METALUX", Available online at: http://www.cooperindustries.com/content/dam/public/lighting/products/documents/metalux/spec_sheets/110042_Cruze_Retro_2×2.pdf, 2 pages (Available at least on Aug. 12, 2015).

Cooperindustries, "Cooper Lighting—Metalux", available online at: http://www.cooperindustries.com/content/dam/public/lighting/products/documents/metalux/spec_sheets/101331_Cruze_Retro_2×4.pdf, 3 pages (Available at least on Aug. 12, 2015).

"Ambient Light Engine Samsung LED Global," H Series Gen3, available online at http://www.samsung.com/global/business/led/products/led-engine/ambient-light-engine (2 pages) (Available at least on Oct. 21, 2016).

U.S. Appl. No. 15/247,224, "Non-Final Office Action," dated Mar. 26, 2018, 16 pages.

* cited by examiner

PRINTED CIRCUIT BOARD MOUNTING WITH TABS

FIELD OF THE INVENTION

Embodiments of the present invention relate to systems and methods for securing printed circuit boards onto substrates.

BACKGROUND OF THE INVENTION

Conventional printed circuit boards (PCB) with light emitting diodes (LEDs) are attached and retained to substrates, such as heat sinks or light fixture housings, using mechanical fasteners such as screws. However, assembly using mechanical fasteners can be time consuming. Moreover, the PCB can bow during installation and/or during use due to thermal expansion. A bowed board can result in decreased lumen output and decreased LED life.

BRIEF SUMMARY OF THE INVENTION

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

Embodiments of the present invention relate to systems and methods for securing one or more printed circuit boards to a substrate to form a light engine. The substrate may include retention tabs that form a receiving slot that receives an edge of the printed circuit board. The retention tabs and printed circuit board may have corresponding engaging features designed to retain the printed circuit board within the receiving slot and that, in some embodiments, can permit slight movement of the printed circuit board within the receiving slot to accommodate any thermal expansion of the board during use.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Embodiments of the present invention provide retention tabs having snap fit features. These retention tabs help secure printed circuit boards to substrates using a simple one-directional motion while permitting slight movement of the printed circuit board once it has been secured to accommodate any bowing that might occur.

The retention tabs described herein may include one or more retention features that may each interface with a corresponding feature formed on the printed circuit board to secure the printed circuit board between a retention tab and the substrate. For example, the retention features of the retention tab may include a protrusion designed to be snap fit within an aperture formed within the printed circuit board.

Figure 1:
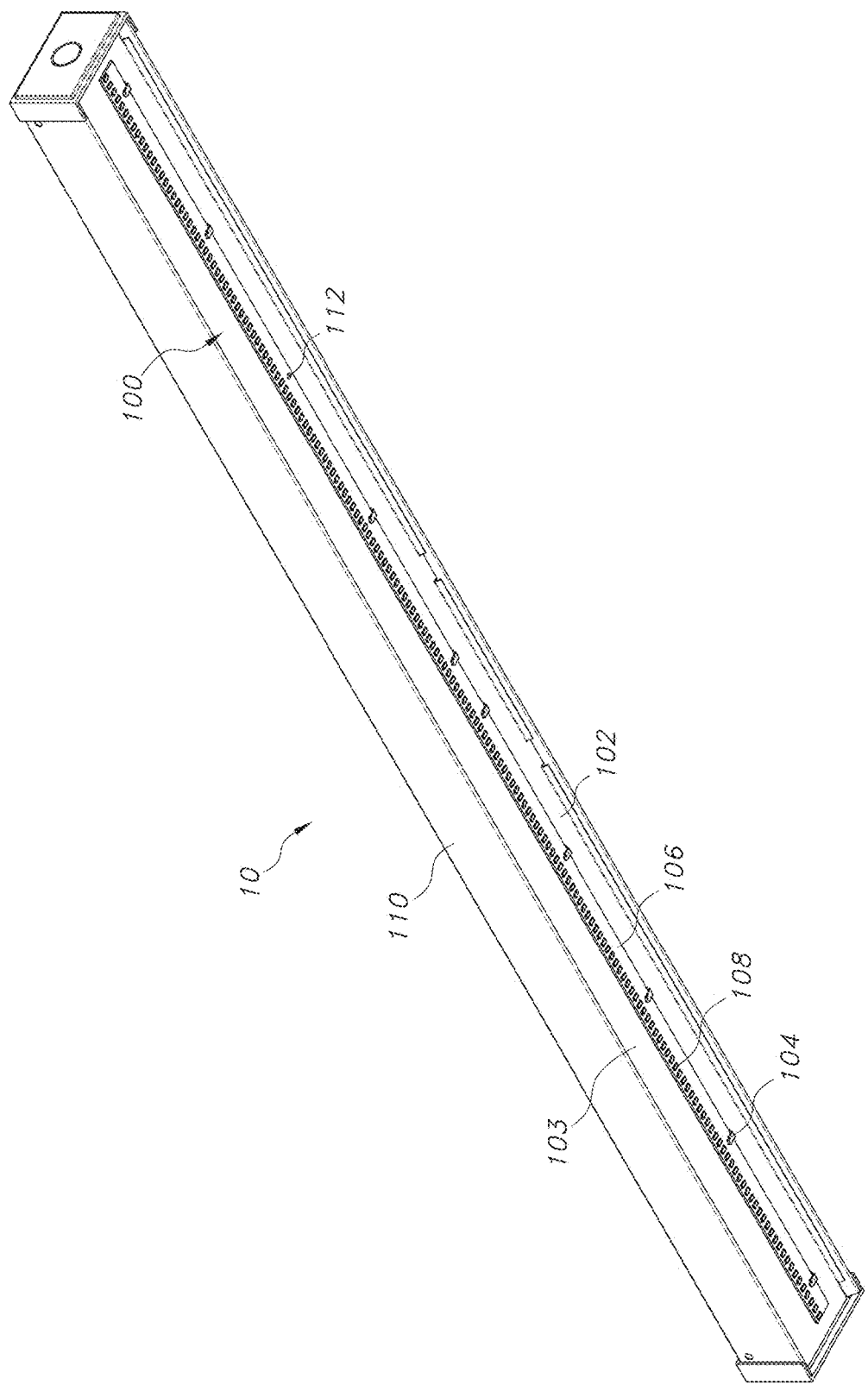
FIG. 1 is a bottom perspective view of a light fixture in which a light engine according to embodiments of the present invention is positioned.
Figure 2:
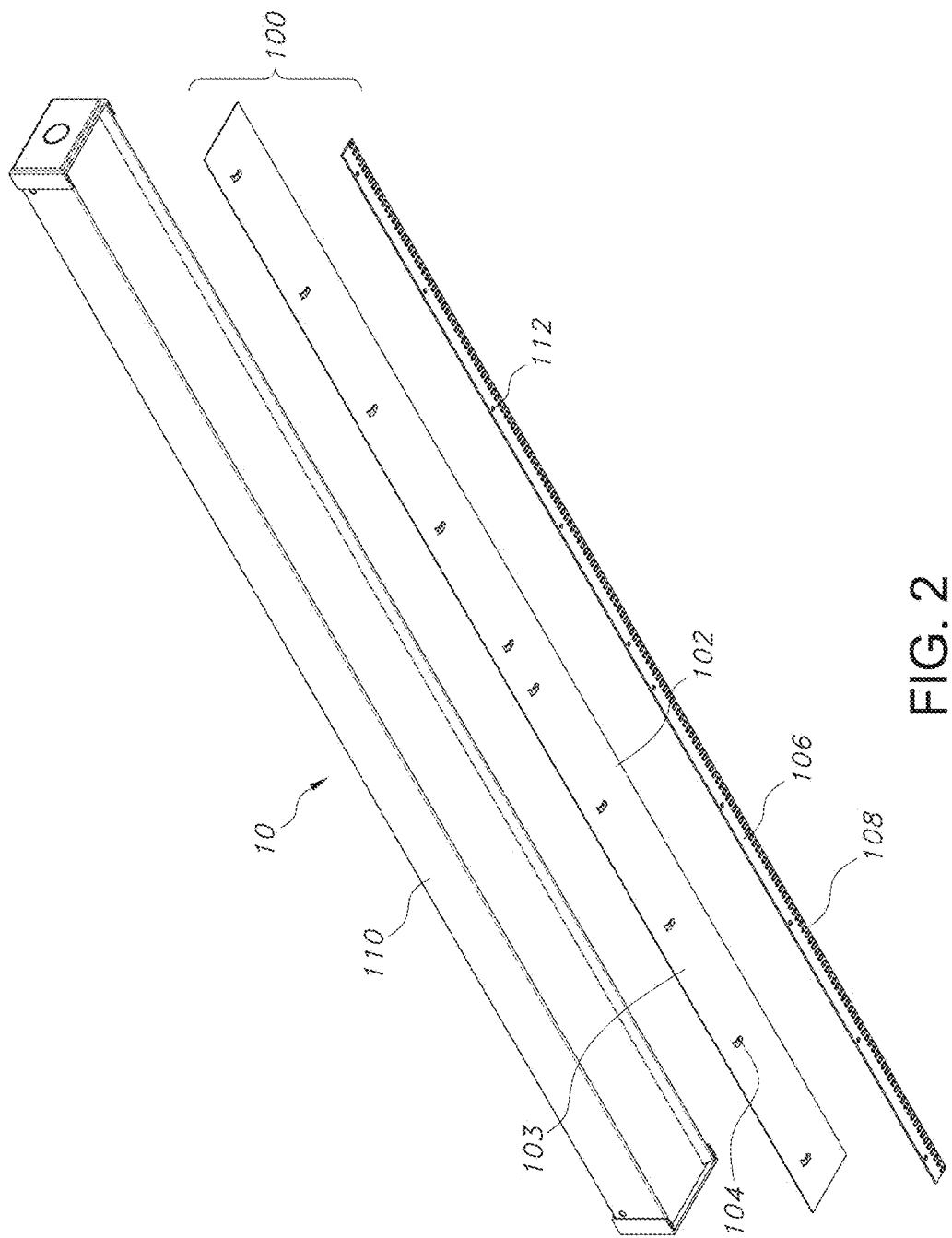
FIG. 2 is an exploded view of the light fixture of FIG. 1.
Figure 3:
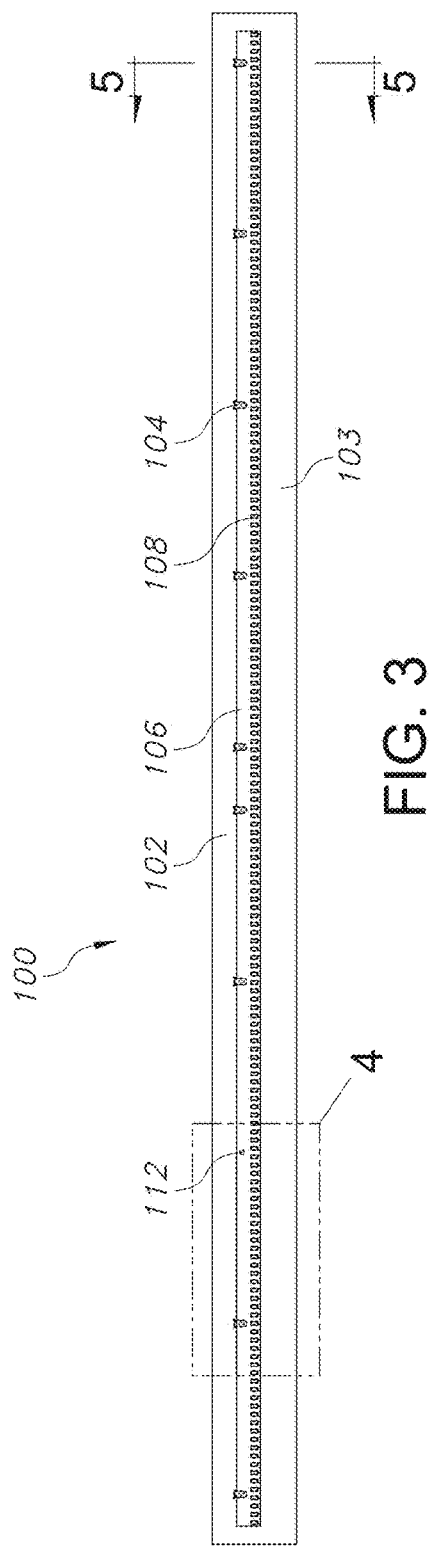
FIG. 3 is a bottom plane view of the light engine of FIG. 1 in isolation according to embodiments of the present invention.
Figure 4:
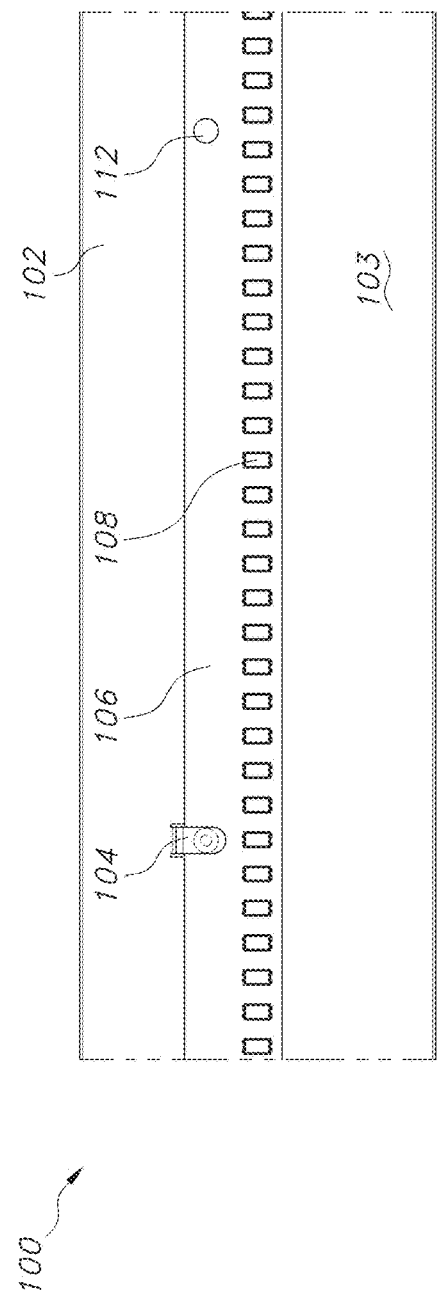
FIG. 4 is an enlarged section view taken at inset rectangle 4 in FIG. 3 according to embodiments of the present invention.

Turning to FIG. 1 and FIG. 2, a light fixture 10 that houses one embodiment of a light engine 100 within a housing 110 is shown. The light engine 100 is shown in isolation in FIG. 3 and FIG. 4. The light engine 100 may include a substrate 102 from which at least one retention tab 104 extends and a printed circuit board 106 having a width, a length, a longitudinal axis, and two opposing side edges extending along the length. The printed circuit board 106 may contain a plurality of light emitting diodes (LEDs) 108 extending at least partially along the length of the printed circuit board 106. The printed circuit board 106 is mounted onto the substrate 102 via the at least one retention tab 104. In some embodiments, the substrate 102 is formed of a thermally conductive material that dissipates heat generated by the LEDs 108. For example, the substrate 102 may be formed of metal (e.g., aluminum) or a thermally-conductive plastic.

In some embodiments, the substrate 102 has a substantially planar upper surface 103 with a plurality of retention tabs 104 extending upwardly from the upper surface 103 of the substrate 102. Embodiments of the retention tabs 104 may include an upstanding arm 105 that extends upwardly at an angle from the substrate 102. In the illustrated embodiment, the upstanding arm 105 extends substantially perpendicular (i.e., at substantially a 90° angle) to the plane of the substrate 102; however, the upstanding arm 105 could extend at other angles relative to the substrate 102. A retention arm 107 extends from the upstanding arm 105 in a plane above the substrate 102. In some embodiments, the retention arm 107 extends in a plane that is substantially parallel to the plane of the upper surface 103 of the substrate 102. However, this will not be the case in all embodiments. The retention arm 107 can be of any length, such as a length that, in use, extends across the entire width, or only across a portion of the width, of the printed circuit board 106.

The retention tab 104 may be integrally formed with the substrate 102. By way only of example, in some embodiments the substrate 102 is formed of metal and the retention tabs 104 are stamped from the metal substrate 102 and bent to have the desired geometry. In other embodiments, the substrate may be formed of plastic and the retention tabs 104 molded integrally with the substrate 102.

Figure 5:
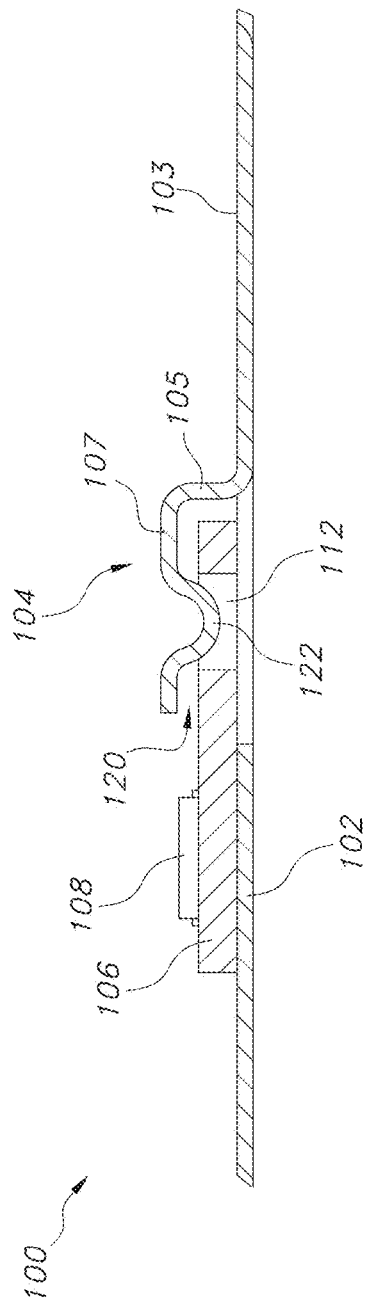
FIG. 5 is a cross-sectional view taken along line 5-5 in FIG. 3.
Figure 6:
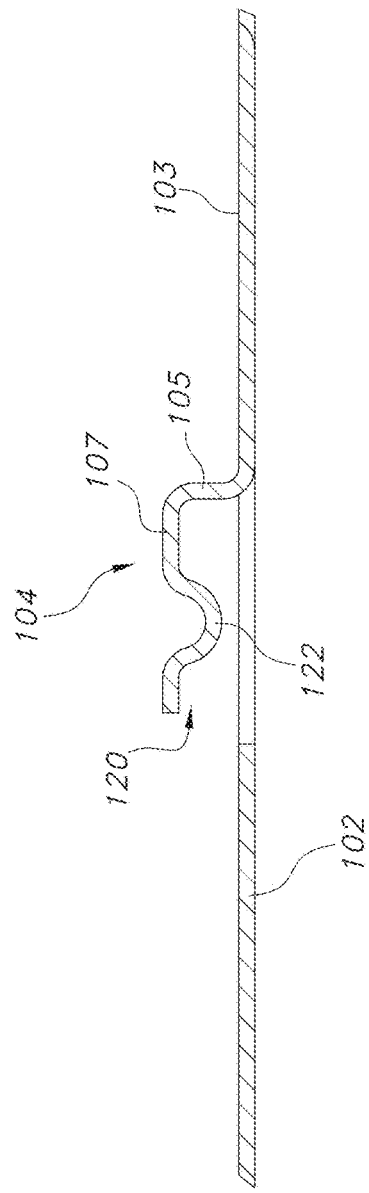
FIG. 6 is a cross-sectional view of the substrate of FIG. 5 in isolation.

As best seen in FIGS. 5 and 6, a receiving slot 120 is formed between the retention arm 107 and the substrate 102 for receiving an edge of a printed circuit board 106. In some embodiments, the retention tab 104 includes a protrusion 122 extending from the bottom of the retention arm 107 toward the substrate 102. The protrusion 122 is geometrically configured to engage with a receiver 112 on the printed circuit board 106 to secure the printed circuit board 106 in the receiving slot 120. The receiver 112 may be an aperture that extends entirely through the printed circuit board 106 or, in addition or alternatively, may be a depression or divot provided on the upper surface of the printed circuit board 106 that does not extend entirely through the printed circuit board 106. Regardless, the printed circuit board 106 may have any number of receivers 112 located along one or both side edges of the printed circuit board 106.

The printed circuit board 106 may be secured to the substrate 102 by laterally sliding a side edge of the printed circuit board 106 into the receiving slot 120 until the protrusions 122 of the retention tabs 104 seat in the receivers 112 on the printed circuit board 106, thereby locking the printed circuit board 106 to the substrate 102. In some embodiments, the vertical distance between the distal most point of the protrusion 122 and the upper surface 103 of the substrate 102 is less than the thickness of the printed circuit board 106 such that the retention arm 107 deflects upwardly when the printed circuit board 106 is inserted into the receiving slot 120 so as to create a snap-fit engagement. Moreover, when the printed circuit board 106 is positioned within the receiving slot 120, the retention arm 107 is biased towards the printed circuit board 106 to help prevent disengagement of the protrusion 122 from the receiver 112. FIG. 5 shows a printed circuit board 106 engaged with the retention tab 104 of the substrate 102 using a snap fit engagement between the protrusion 122 on a retention tab 104 and a receiver 112 on the printed circuit board 106. This snap fit design enables the retention tab 104 to securely hold the printed circuit board 106 to the substrate 102. In some embodiments, the protrusion 122 does not occupy the entirety of the receiver 112 such that the protrusion is still able to move slightly, but still remain seated, within the receiver 112. This allows slight movement of the printed circuit board 106 relative to the substrate to accommodate any expansion, and prevent bowing, of the printed circuit board 106.

Embodiments of the present invention relate to a method for securing a printed circuit board 106 to a substrate 102. This is done by placing the printed circuit board 106 on the upper surface 103 of the substrate 102 such that at least some of the receivers 112 on the printed circuit board 106 align with at least some of the retention tabs 104 on the substrate 102. The user may then laterally slide the printed circuit board 106 on the upper surface of the substrate 102 so that the printed circuit board 106 is moved into the receiving slot 120. This sliding motion may be performed using a one-directional movement where the movement is substantially parallel to the plane of the upper surface 103 of the substrate 102 and/or substantially perpendicular to the length of the printed circuit board 106. Once the printed circuit board 106 has been moved into the receiving slot 120, the receivers 112 may engage with the protrusions 122 extending from the retention arms 107 to secure the printed circuit board 106 to the substrate 102.

In some embodiments, the user may toggle, or move slightly in various directions, the printed circuit board 106 to remove any potential bowing that might have formed in the printed circuit board 106 during installation. During this toggling, the protrusions 122 and the receivers 112 remain engaged with each other so the printed circuit board 106 remains secured to the substrate 102. In some embodiments, the printed circuit board 106 is toggled in a direction substantially parallel to the plane of the substrate 102 and substantially parallel to the length of the printed circuit board 106.

It should be noted that the systems and devices discussed above are intended merely to be examples. It must be stressed that various embodiments may omit, substitute, or add various procedures or components as appropriate. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known structures and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A light engine comprising a printed circuit board and a substrate, wherein:
   the printed circuit board comprises a width, a length, a longitudinal axis, at least one side edge, a plurality of light emitting diodes (LEDs) extending at least partially along the length of the printed circuit board, and at least one receiver located proximate the at least one side edge; and the substrate comprises a substrate body having an upper surface extending in a plane and at least one retention tab comprising an upstanding arm extending from the substrate body and a retention arm extending from the upstanding arm, wherein the retention arm comprises a protrusion and wherein the retention arm extends in a plane above the plane of the upper surface of the substrate body such that a receiving slot is formed between the retention arm and the upper surface of the substrate body, wherein the receiving slot is configured to receive a portion of the at least one side edge of the printed circuit board and wherein the at least one receiver is configured to receive the protrusion on the retention arm.

2. The light engine of claim 1, wherein the retention arm extends across only a portion of the width of the printed circuit board.

3. The light engine of claim 1, wherein the protrusion extends from a lower side of the retention arm.

4. The light engine of claim 1, wherein the at least one retention tab comprises a plurality of retention tabs and wherein the at least one receiver comprises a plurality of receivers, wherein at least some of the plurality of receivers each receives the protrusion of one of the plurality of retention tabs.

5. The light engine of claim 1, wherein the protrusion is moveable within the at least one receiver when the protrusion is received in the at least one receiver.

6. The light engine of claim 1, wherein the printed circuit board is configured to snap fit into the receiving slot so as to secure the printed circuit board between the retention arm and the substrate body.

7. The light engine of claim 1, wherein the at least one receiver comprises at least one of an aperture or a depression.

8. The light engine of claim 1, wherein the retention arm extends in a plane substantially parallel to the plane of the upper surface of the substrate body and to a substantially horizontal plane of the receiving slot.

9. The light engine of claim 1, wherein the upstanding arm extends from the substrate body in a direction substantially perpendicular to the plane of the upper surface of the substrate body and to a substantially horizontal plane of the receiving slot.

10. The light engine of claim 1, wherein the at least one retention tab is formed integrally with the substrate body.

11. The light engine of claim 1, wherein the substrate body comprises a thermally-conductive material.

12. The light engine of claim 11, wherein the thermally-conductive material comprises a metallic or polymeric material.

13. A method of securing a printed circuit board to a substrate, wherein the printed circuit board comprises a width, a length, a longitudinal axis, at least one side edge, at least one receiver located a distance from the at least one side edge, and a plurality of LEDs extending at least partially along the length of the printed circuit board and wherein the substrate comprises a substrate body having an upper surface extending in a plane and at least one retention tab comprising an upstanding arm extending from the substrate body and a retention arm comprising a protrusion and extending from the upstanding arm in a plane above the plane of the upper surface of the substrate body such that a receiving slot is formed between the retention arm and the upper surface of the substrate body, the method comprising:

a. positioning the printed circuit board on the upper surface of the substrate such that at least a portion of the at least one side edge of the printed circuit board extends substantially parallel to the upstanding arm;

b. aligning the at least one receiver on the printed circuit board with the at least one retention tab;

c. sliding the printed circuit board into the receiving slot; and d. engaging the at least one receiver on the printed circuit board with the protrusion on the retention arm of the at least one retention tab such that the protrusion seats within the at least one receiver.

14. The method of claim 13, wherein:

the at least one retention tab comprises a plurality of retention tabs;

the at least one receiver comprises a plurality of receivers;

aligning the at least one receiver on the printed circuit board with the at least one retention tab comprises aligning at least some of the plurality of receivers with at least some of the plurality of retention tabs; and engaging the at least one receiver on the printed circuit board with the protrusion on the retention arm of the at least one retention tab comprises engaging the at least some of the plurality of receivers with the protrusion on the retention arm of the at least some of the plurality of retention tabs.

15. The method of claim 13, wherein sliding the printed circuit board into the receiving slot further comprises sliding the printed circuit board in a direction substantially perpendicular to the length of the printed circuit board.

16. A light engine comprising a printed circuit board and a substrate, wherein:

the printed circuit board comprises a width, a length, a longitudinal axis, a side edge, a plurality of receivers located proximate the side edge, and a plurality of light emitting diodes (LEDs) extending at least partially along the length of the printed circuit board;

the substrate comprises a substrate body having an upper surface extending in a plane and a plurality of retention tabs formed integrally with the substrate body and each comprising an upstanding arm extending from the substrate body and a retention arm extending from the upstanding arm, wherein the retention arm comprises a protrusion extending from a lower side of the retention arm and wherein the retention arm extends in a plane above the plane of the upper surface of the substrate body such that a receiving slot is formed between the retention arm and the upper surface of the substrate body, wherein the receiving slot is configured to receive a portion of the side edge of the printed circuit board; and when the side edge of the printed circuit board is positioned within the receiving slot formed between the retention arm of the plurality of retention tabs and the upper surface of the substrate body, the retention arm extends across only a portion of the width of the printed circuit board and the protrusion on the retention arm of at least some of the plurality of retention tabs seats within one of the plurality of receivers on the printed circuit board.

17. The light engine of claim 16, wherein the protrusion on the retention arm of the at least some of the plurality of retention tabs is moveable within the one of the plurality of receivers on the printed circuit board when the protrusion is seated within the one of the plurality of receivers.

\* \* \* \* \*